(12) United States Patent
Schulz et al.

(10) Patent No.: US 9,939,556 B2
(45) Date of Patent: Apr. 10, 2018

(54) METHOD FOR PRODUCING A REFLECTION-REDUCING LAYER SYSTEM AND REFLECTION-REDUCING LAYER SYSTEM

(71) Applicant: Fraunhofer-Gesellschaft zur Förderung der angewandten Forschung e.V., Munich (DE)

(72) Inventors: Ulrike Schulz, Jena (DE); Friedrich Rickelt, Jena (DE); Peter Munzert, Jena (DE); Hanno Heiße, Jena (DE); Heiko Knopf, Jena (DE); Kevin Füchsel, Jena (DE); Norbert Kaiser, Jena (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 135 days.

(21) Appl. No.: 15/008,392

(22) Filed: Jan. 27, 2016

(65) Prior Publication Data
US 2016/0216409 A1    Jul. 28, 2016

(30) Foreign Application Priority Data
Jan. 27, 2015 (DE) .................. 10 2015 101 135

(51) Int. Cl.
*G02B 1/10* (2015.01)
*G02B 1/118* (2015.01)
(Continued)

(52) U.S. Cl.
CPC ............... *G02B 1/118* (2013.01); *B05D 1/60* (2013.01); *B05D 3/145* (2013.01); *B29C 59/14* (2013.01);
(Continued)

(58) Field of Classification Search
CPC .......... G02B 1/118; G02B 1/14; G02B 1/111; B05D 1/60; B05D 3/145; B29C 59/14;
(Continued)

(56) References Cited

U.S. PATENT DOCUMENTS 4,934,788 A * 6/1990 Southwell ............. C03C 17/002
359/586
6,379,014 B1 * 4/2002 Li ........................ G02B 1/115
359/580
(Continued)

FOREIGN PATENT DOCUMENTS

DE       10241708 B4    9/2005
DE    102008018866 A1   10/2009
(Continued)

OTHER PUBLICATIONS

U. Schulz, P. Munzert, R. Leitel, N. Bollwahn, I. Wendling, N. Kaiser, A. Tünnermann, "New plasma processes for antireflective structures on plastics," Proc. SPIE 7101, Advances in Optical Thin Films III, 710107 (Sep. 25, 2008); doi: 10.1117/12.796705.*
(Continued)

*Primary Examiner* — Bumsuk Won
*Assistant Examiner* — Collin X Beatty
(74) *Attorney, Agent, or Firm* — Slater Matsil, LLP

(57) ABSTRACT

A method for producing a reflection-reducing layer system on a substrate and a reflection-reducing layer system are disclosed. According to an embodiment the method includes depositing a refractive index gradient layer on the substrate by co-evaporation of an inorganic material and an organic material, wherein the refractive index gradient layer has a refractive index which decreases in a growth direction, depositing an organic layer above the refractive index gradient layer, and producing a nanostructure in the organic layer by a plasma etching process.

11 Claims, 5 Drawing Sheets

(51) Int. Cl.
*B29C 59/14* (2006.01)
*G02B 1/111* (2015.01)
*G02B 1/14* (2015.01)
*B05D 1/00* (2006.01)
*B05D 3/14* (2006.01)
*C23C 14/28* (2006.01)
*C23C 14/06* (2006.01)
*C23C 14/10* (2006.01)
*C23C 14/12* (2006.01)
*C23C 14/32* (2006.01)

(52) U.S. Cl.
CPC ............... *C23C 14/06* (2013.01); *C23C 14/10* (2013.01); *C23C 14/12* (2013.01); *C23C 14/28* (2013.01); *C23C 14/32* (2013.01); *G02B 1/111* (2013.01); *G02B 1/14* (2015.01)

(58) Field of Classification Search
CPC ......... C23C 14/06; C23C 14/10; C23C 14/12; C23C 14/28; C23C 14/32
USPC .................................................. 359/577–590
See application file for complete search history.

(56) References Cited

U.S. PATENT DOCUMENTS

| | | | |
|---|---|---|---|
| 8,169,705 B2 * | 5/2012 | Cangemi | C23C 14/06 359/586 |
| 8,192,639 B2 | 6/2012 | Schulz et al. | |
| 9,039,906 B2 | 5/2015 | Schulz et al. | |
| 2005/0233083 A1 | 10/2005 | Schulz et al. | |
| 2011/0051246 A1 * | 3/2011 | Schulz | G02B 1/111 359/586 |
| 2013/0027779 A1 * | 1/2013 | Okuno | G02B 1/118 359/586 |

FOREIGN PATENT DOCUMENTS

| | | |
|---|---|---|
| DE | 102013106392 A1 | 12/2014 |
| WO | 2014202375 A1 | 12/2014 |

OTHER PUBLICATIONS

Schulz et al., "Antireflection of transparent polymers by advanced plasma etching procedures", Optics Express, vol. 15, No. 20, Oct. 1, 2007, 6 pages.

Joo, W. et al., "Broadband antireflection coating covering from visible to near infrared wavelengths by using multilayered nanoporous block copolymer films," Langmuir, Issue 26, No. 7, Apr. 6, 2010, pp. 5110-5114.

Kaless, A., et al., "Nano-motheye antireflection pattern by plasma treatment of polymers", Surface & Coatings Technology, vol. 200, Mar. 5, 2005, pp. 58-61.

Kennedy, S.R. et al., "Porous broadband antireflection coating by glancing angle deposition," Applied Optics, Issue 12, No. 22, Aug. 2003, pp. 4573-4579.

Präfke, V, "Vakuumgedampfte organisch-anorganisch Hybridschichten für den UV-Schutz von Bisphenol-A-Polycarbonat (Vakuumgedampfte organic-inorganic hybrid layers for the UV protection of bisphenol-A-polycarbonate)", Froedrocj-Schiller-Universität Jena, Nov. 14, 2013, 136 pp.

* cited by examiner

METHOD FOR PRODUCING A REFLECTION-REDUCING LAYER SYSTEM AND REFLECTION-REDUCING LAYER SYSTEM

This application claims priority to German Patent Application No. 10 2015 101 135.2, filed on Jan. 27, 2015, which application is hereby incorporated herein by reference.

TECHNICAL FIELD

The invention relates to a reflection-reducing layer system and to a method for producing same on a substrate, and in particular, on a curved glass or plastics substrate for optical applications.

BACKGROUND

In order to provide an antireflection arrangement for surfaces, in particular for optical elements or displays, use is usually made of reflection-reducing interference layer systems containing a plurality of alternating layers of high refractive index and low refractive index materials. At the present time, $MgF_2$ where n=1.38 is used as material having a particularly low refractive index in the visible spectral range. The antireflection effect of conventional dielectric layer systems could be improved if materials having a lower refractive index were available.

An alternative possibility for reducing the reflection of an optical element is known from the German patent specification DE 10241708 B4, also published as U.S. Patent Publication No. 2005/0233083 A1. In this method, a nanostructure is produced at the surface of a plastics substrate by means of a plasma etching process, the reflection of the plastics substrate being reduced by said nanostructure. Providing an optical element with an antireflection arrangement by producing a nanostructure at the surface of said optical element has the advantage of achieving low reflection over a wide angle-of-incidence range.

The German patent document DE 102008018866 A1, also published as U.S. Pat. No. 8,192,639 B2, describes a reflection-reducing interference layer system to which an organic layer is applied, said organic layer being provided with a nanostructure by means of a plasma etching process.

However, plasma-etched nanostructures attain only a depth of 100 nm to 200 nm on most materials. Such a thickness, for planar and slightly curved surfaces, suffices to provide an antireflection arrangement for a substrate in the visual spectral range of 400 nm to 700 nm for angles of light incidence of 0° (perpendicular light incidence) to 60° in such a way that the residual reflection is only approximately 1%. In some instances, however, there is a demand for broadband antireflection arrangements which are intended to function over even greater ranges of angles of light incidence.

Producing an antireflection layer on low refractive index (n<1.7) surfaces that are greatly curved poses a particular problem. A layer deposited by a directional vacuum coating process such as sputtering or vapor deposition has, at the location at which it grows, a thickness that is dependent on the angle of the impinging vapor. The layer thickness decreases as the incidence angle increases. In the case of an interference layer system, therefore, the physical thickness d of all the layers decreases as the incidence angle increases. However, the optical thickness n*d, where n is the refractive index, is of importance for the optical function. The refractive index n varies in the layer systems consisting of high refractive index and low refractive index materials, with the result that the optical function additionally varies with varying thickness. On account of this problem, the residual reflection of antireflection layers in the edge region of lenses generally has undesirably high values.

An improvement could be achieved if a low refractive index gradient layer could be produced with a thickness such that a decrease in thickness of at least 50% is tolerated. The technical realization on high refractive index substrates (n>1.7) proves to be simpler than on the conventional low refractive index glasses since a layer construction in which the refractive index gradually decreases can be realized even with natural materials.

There are technically only a small number of possibilities for producing relatively thick layers having an effective refractive index of <1.38. The document W. Joo, H. J. Kim and J. K. Kim, "Broadband Antireflection Coating Covering from Visible to Near Infrared Wavelengths by Using Multilayered Nanoporous Block Copolymer Films", Langmuir 26(7), 2010, 5110-5114, describes the production of a thick gradient layer by means of sol-gel processes, but deposition on curved surfaces could be difficult here.

A method for producing multilayered gradient layers using vacuum technology is known from the document S. R. Kennedy, M. J. Brett, "Porous Broadband Antireflection Coating by Glancing Angle Deposition", Appl Opt. 42, 4573-4579, 2003. In that case, oxides or fluorides are vapor-deposited onto the substrate at an oblique angle. Porous layers likewise arise here as a result of shading effects. For this reason, therefore, the substrate has to be positioned obliquely with respect to the angle of vapor incidence. On a greatly curved surface, however, additional shading effects would occur as a result of lens geometry, and so the method cannot readily be employed for curved lenses.

The International Patent Publication document WO 2014/202375 A1, also published as U.S. Pat. No. 9,039,906 B2 describes a reflection-reducing layer system comprising two nanostructured layers arranged one above the other. A broadband antireflection arrangement is achieved as a result, although scattered light losses can possibly arise as a result of the inner nanostructured layer.

SUMMARY

Embodiments of the invention specify an improved reflection-reducing layer system and a method for producing same with which various surfaces can be provided with a broadband and angle-independent antireflection arrangement, wherein the reflection-reducing layer system is intended to be distinguished, in particular, by low light scattering and improved adhesion on a substrate.

In accordance with at least one configuration of the method for producing the reflection-reducing layer system on a substrate, a first step involves depositing a refractive index gradient layer by coevaporation of an inorganic material and an organic material on the substrate. The refractive index gradient layer advantageously has a refractive index which decreases in the growth direction. In other words, the refractive index of the refractive index gradient layer decreases, proceeding from the substrate, toward the surface of the reflection-reducing layer system. Particularly preferably, the refractive index of the refractive index gradient layer decreases continuously, that is to say without steps, in the growth direction.

In accordance with at least one configuration, in a subsequent step, an organic layer is deposited above the refractive index gradient layer and a nanostructure is produced in the organic layer by means of a plasma etching process. In this way, a refractive index gradient is advantageously produced in the layer composed of the organic material, wherein the refractive index of the organic layer decreases in the growth direction, i.e., in a direction running from the substrate to the surface. The nanostructure preferably has a multiplicity of structure elements whose heights are on average between 80 nm and 130 nm. The spacings of the structure elements, i.e., the distances between respectively adjacent elevations of the nanostructure, are advantageously on average less than 100 nm.

The reflection-reducing layer system thus produced is distinguished, in particular, by the fact that the refractive index both in the refractive index gradient layer produced by coevaporation of the inorganic material and organic material and in the subsequent organic layer provided with a nanostructure decreases in each case in the direction pointing from the substrate to the surface of the reflection-reducing layer system. Overall, a refractive index which decreases over a comparatively large thickness range is achieved in this way. This has the advantage that even on curved surfaces a very good antireflection arrangement is achieved in a large angular range.

Furthermore, the reflection-reducing layer system is distinguished by comparatively low light scattering since the nanostructure is formed only at the surface of the layer system. The light scattering of the reflection-reducing layer system described here is low in particular compared with alternative reflection-reducing layer systems in which a plurality of nanostructured and/or porous layers are arranged one above another.

The production of the refractive index gradient layer adjoining the substrate by coevaporation of an inorganic material and an organic material additionally has the advantage that the elastic and thermoelastic properties of the refractive index gradient layer can be matched to the substrate material. The substrate can be a plastics substrate, for example. It is known that inorganic layers such as MgF2, for example, often adhere poorly on plastics since the layers deposited at low temperatures generally have tensile stresses. Such layers readily form cracks upon heating, particularly if, as is the case for plastics, the thermal expansion of the substrate material is significantly higher than that of the layer. As a result of the admixture of an organic material with the inorganic material as proposed here, it is advantageously possible to reduce the tensile stress of the refractive index gradient layer adjoining the substrate and thus to achieve improved adhesion on the substrate.

The concentration of the organic material in the refractive index gradient layer can be in particular 95% or less at the interface with the substrate.

The concentration of the organic material is preferably 5% or less in the topmost region, i.e., at that interface of the refractive index gradient layer which faces away from the substrate.

The refractive index gradient layer advantageously has a thickness of between 70 nm and 200 nm, preferably approximately 150 nm.

The inorganic material of the refractive index gradient layer preferably has a refractive index n1 where $1.37 \leq n1 \leq 1.46$. The inorganic material can be in particular an oxide or fluoride. Particularly preferably, the inorganic material is magnesium fluoride ($MgF_2$) or silicon dioxide ($SiO_2$). Alternatively, fluorides such as $AlF_3$, for example, or fluoride mixtures such as cryolite, for example, which have a refractive index of less than 1.4 are also particularly well suited.

The organic material of the refractive index gradient layer advantageously has a refractive index n2 that is greater than the refractive index n1 of the inorganic material. Particularly preferably, $1.6 \leq n2 \leq 1.9$. Melamine is preferably used as organic material.

The spatially varying refractive index $n_{gl}(z)$ of the refractive index gradient layer, where z is a spatial coordinate pointing in the growth direction, can advantageously be varied by a spatial variation of the concentration of the inorganic material and of the organic material between the refractive index n1 of the inorganic material and the refractive index n2 of the organic material. In particular, therefore, $n1 \leq n_{gl}(z) \leq n2$.

The refractive index gradient layer is advantageously produced by vacuum deposition, in particular by plasma ion assisted deposition. For the plasma ion assisted deposition of the refractive index gradient layer, use is advantageously made of an ion source which generates ions having comparatively low ion energies of between 45 eV and 60 eV. The ion source is preferably operated with nitrogen or some other inert gas.

The concentration gradient in the refractive index gradient layer is produced, in particular, by virtue of the fact that the particle streams of the organic material and of the inorganic material that impinge on the substrate are varied during the growth of the refractive index gradient layer. For this purpose, at least one parameter is varied which influences the particle stream and thus the deposition rate of the inorganic material and/or of the organic material at the substrate. By way of example, a quartz oscillator measurement system can be used for measuring the deposition rates. With the use of evaporation sources for deposition, by way of example, the heating power of the evaporation sources is varied over time during the deposition of the refractive index gradient layer.

Preferably, the refractive index of the refractive index gradient layer at the interface with the substrate is matched to a refractive index of the substrate. For this purpose, at the beginning of the growth of the refractive index gradient layer, the concentrations of the inorganic material and of the organic material are chosen such that the refractive index of the refractive index gradient layer in the region of the interface with the substrate substantially corresponds to the refractive index of the substrate. Preferably, the refractive index of the refractive index gradient layer in the region of the interface with the substrate deviates from the refractive index of the substrate by not more than 0.1, particularly preferably not more than 0.05. By matching the refractive index of the refractive index gradient layer to the substrate, a particularly good antireflection arrangement is achieved since in particular the reflection at the interface between the substrate and the adjoining refractive index gradient layer is minimized.

In one advantageous configuration, the organic material of the refractive index gradient layer is a UV-absorbing material. The use of a UV-absorbing material advantageously makes it possible to integrate the additional function of UV protection into the reflection-reducing layer system. Suitable UV-absorbing materials are, for example, 2,2'-methylenebis(6-(2H-benzotriazol-2-yl)-4-1,1,3,3-tetramethylbutyl)phenol (MBP), 2-(4,6-diphenyl-1,3,5-triazi-2-yl)-5 [(hexyl)oxy]phenol (Tinuvin 1577), ethyl-2-cyano-3-(4-hydroxyphenyl)acrylate (semaSORB 20106), methyl-2-cyano-3-(4-hydroxyphenyl)acrylate (semaSORB 20163), N-[3-(2H-benzotriazol-2-yl)-2-hydroxy-5(tert-octyl)phenyl]-N'-phenylurea (semaSORB UV180) or propanoic acid, 2-[4-[4,6-bis([1,1'-biphenyl]-4-yl)-1,3,5-triazin-2-yl]-3-hydroxyphenoxy]-, isooctyl ester (Tinuvin 479).

In accordance with one preferred configuration, the organic layer arranged above the refractive index gradient layer is applied with a layer thickness of between 250 nm and 400 nm. In the case of a layer thickness in this range, the organic layer is, on the one hand, thick enough that a sufficiently deep nanostructure can be produced in it and, on the other hand, thin enough that a refractive index gradient extending right into the region of the interface with the underlying refractive index gradient layer produced by coevaporation can be produced in said organic layer.

The organic layer is preferably applied by means of plasma ion assisted deposition. As in the deposition of the refractive index gradient layer, use is advantageously made of an ion source which generates ions having comparatively low ion energies of between 45 eV and 60 eV. The ion source is preferably operated with nitrogen or some other inert gas such as argon, for example.

The organic layer preferably has at least regionally an effective refractive index of between 1.05 and 1.38. Here and hereinafter, the effective refractive index should be understood to mean the refractive index averaged over the nano structure, the value of which, on account of the cutouts in the organic layer that are produced by the nanostructure, is advantageously lower than the refractive index of a continuous layer composed of the material of the organic layer. Advantageously, the organic layer has at the surface a region which has a thickness of at least 100 nm and in which the effective refractive index is less than 1.20, preferably less than 1.15.

A multiplicity of materials in which a nanostructure can be produced by means of a plasma etching process are advantageously suitable for the organic layer. Preferably, the organic layer contains one of the following materials: 2,4,6-triamino-1,3,5-triazine (melamine), 2,2'-methylenebis(6-(2H-benzotriazol-2-yl)-4-1,1,3,3-tetramethylbutyl)phenol (MBP), N,N'-bis(3-methylphenyl)-N,N'-diphenylbenzidine (TPD), N,N'-di(naphtha-1-yl)-N,N'-diphenylbenzidine (NPB), N,N,N',N'-tetraphenylbenzidine (TPB), tris(4-carbazoyl-9-ylphenyl)amine (TCTA).

Furthermore, the UV-absorbing materials mentioned above for the organic material of the refractive index gradient layer are also suitable for the organic layer.

In one configuration of the method, before applying the organic layer, an inorganic intermediate layer is applied to the nanostructure. The inorganic intermediate layer preferably comprises $SiO_2$. The layer thickness of the inorganic intermediate layer is advantageously between 2 nm and 15 nm. The inorganic intermediate layer is preferably produced by means of plasma ion assisted deposition, whereby a densification of the layer is achieved during growth. An argon or oxygen plasma is preferably used, with the result that an activated surface is present. The inorganic intermediate layer can have, in particular, the function of an adhesion promoter layer.

In a further advantageous configuration of the method, after producing the nanostructure, an inorganic protective layer is applied to the nanostructure. The inorganic protective layer is preferably an $SiO_2$ layer or an $MgF_2$ layer, wherein these materials are distinguished, in particular, by a low refractive index. The protective layer advantageously has a thickness of between 10 nm and 50 nm. This has the advantage that the effective refractive index at the surface of the nano structure is influenced only insignificantly by the protective layer. Preferably, the effective refractive index of the nanostructured organic layer is increased by not more than 0.1 by the application of the protective layer.

The protective layer is preferably applied by vapor deposition which is a directional deposition process. It has been found that the material of the protective layer is preferably deposited on the elevations of the nanostructure during vapor deposition. Alternatively, the protective layer can be applied by PECVD (plasma enhanced chemical vapor deposition), in particular by polymerization of a suitable organosilicon precursor.

In accordance with at least one advantageous configuration, the entire reflection-reducing layer system is produced in a vacuum process. In particular, all layers contained in the reflection-reducing layer system are applied by vacuum deposition and the nanostructure is produced by a plasma etching process. By virtue of the fact that all production steps can be carried out in a single vacuum process, the production outlay is advantageously reduced.

In one particularly preferred configuration, the organic layer, preferably a melamine layer, is produced by plasma ion assisted deposition using a plasma ion source, wherein the nanostructure is subsequently produced by increasing the ion energy and/or changing the process gas of the plasma ion source. The growth and structuring of the organic layer can thus be carried out in a single method step, in which the operating parameters of the plasma ion source are changed. By way of example, during the deposition of the organic layer, ion assistance with argon, nitrogen or some other inert gas is firstly effected by the plasma ion source at ion energies of between preferably 45 eV and 60 eV. In order to produce the nanostructure, the ion source is then operated with oxygen, for example, and the ion energy is increased to 80 eV to 150 eV.

The reflection-reducing layer system producible by the methods described above advantageously comprises a refractive index gradient layer, which comprises an inorganic material and an organic material in a spatially varying composition, wherein the refractive index gradient layer has a refractive index which decreases in the growth direction. In the reflection-reducing layer system, an organic layer is arranged above the refractive index gradient layer, said organic layer having a surface provided with a nanostructure. The nanostructure preferably has a multiplicity of structure elements whose heights are on average between 80 nm and 130 nm and whose spacings are on average less than 100 nm. The nanostructure in the organic layer advantageously has the effect that the organic layer, too, has a refractive index which decreases in the growth direction. In this way, a refractive index which decreases over a comparatively large range is advantageously achieved in the reflection-reducing layer system. The total thickness of the reflection-reducing layer system is preferably between 250 nm and 450 nm.

The reflection-reducing layer system can be applied to a curved substrate, in particular. On curved substrates, the reflection-reducing layer system has the advantage that a low residual reflection is achieved even if the thicknesses of the individual layers and thus the total thickness of the reflection-reducing layer system decrease toward the edges of the substrate on account of the lower deposition rates on the inclined surface regions. In other words, the reflection-reducing layer system is tolerant to changes in the layer thickness. The substrate can be curved in particular to such a great extent that at least one partial region of the substrate surface is inclined by at least 45° or even by at least 60° with respect to another partial region of the surface.

In particular, with the reflection-reducing layer system, even in an inclined surface region, it is possible to achieve an average reflection of less than 1.5% or preferably even less than 1% in the visible spectral range if the thickness of the reflection-reducing layer system in the inclined surface region is smaller by up to 50% than in a region in which the deposition is carried out with a substantially perpendicular direction of vapor incidence. By way of example, a residual reflection of less than 0.5% can be achieved in the central region on a curved substrate, wherein the residual reflection is still less than 1.5% even in an edge region with an angle of inclination of 60°.

However, the reflection-reducing layer system is also advantageous for planar substrates, particularly if the intention is to achieve a broadband antireflection arrangement over a large wavelength and/or angle-of-incidence range.

The substrate of the reflection-reducing layer system can be a plastics substrate, in particular, but the reflection-reducing layer system can also be used for providing an antireflection arrangement for other materials such as glass, for example. The reflection-increasing layer system can be used in particular for providing an antireflection arrangement for optical elements such as lenses, for example.

BRIEF DESCRIPTION OF THE DRAWINGS

Further advantageous configurations of the reflection-reducing layer system are evident from the above description of the method, and vice versa.

Embodiments of the invention are explained in greater detail below in association with FIGS. 1 to 7.

Identical or identically acting component parts are in each case provided with the same reference signs in the figures. The illustrated component parts and the size relationships of the component parts among one another should not be regarded as true to scale.

DETAILED DESCRIPTION OF ILLUSTRATIVE EMBODIMENTS

Figure 1:
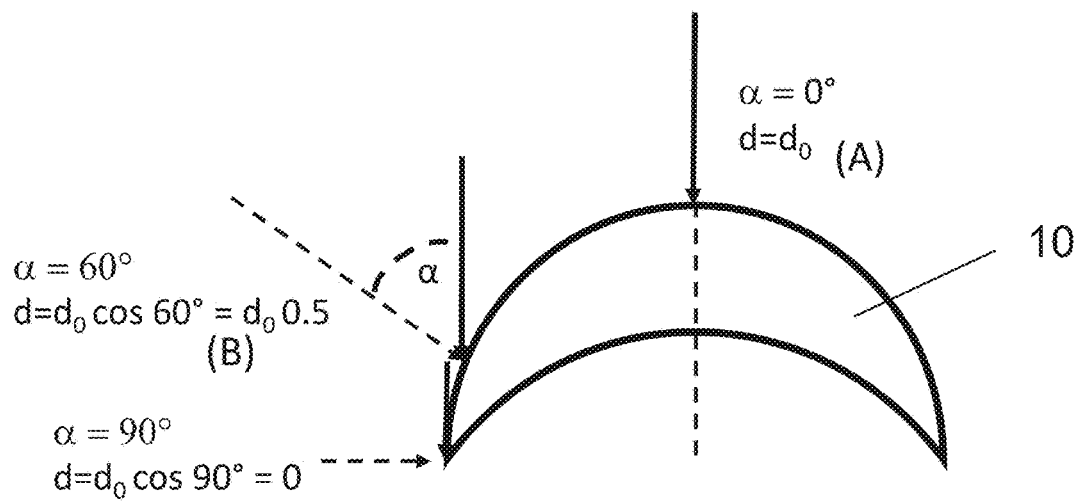
FIG. 1 shows a schematic illustration of a lens—functioning as a substrate—having a spherical surface with an illustration of the layer thickness change for various angles of vapor incidence.

FIG. 1 schematically illustrates a spherical lens which is intended to be provided with an antireflection layer. The spherical lens thus functions as a substrate 10 for the antireflection layer. The lens is, for example, a glass lens having a refractive index $n_s$=1.53. If a layer is deposited by means of a directional vacuum coating process such as, for example, sputtering or vapor deposition on the curved surface of the lens, the layer has, at the location at which it grows, a thickness that is dependent on the angle of the impinging vapor. It is generally known that the following holds true for the layer thickness d as a function of the angle $\alpha$ of vapor incidence on the lens: $d(\alpha)=d_0 \ast \cos \alpha$.

In this case, $d_0$ is the layer thickness in the center of the lens (perpendicular vapor incidence). In the case of a perfect hemisphere, the layer thickness is thus 0 nm at the outermost edge; at least theoretically, no layer at all is deposited. At a point B of the lens, this point having an angle of vapor incidence of $\alpha$=60°, the layer thickness decrease is already 50% compared with the midpoint A of the lens, on which midpoint the vapor impinges perpendicularly ($\alpha$=0°).

Figure 2:
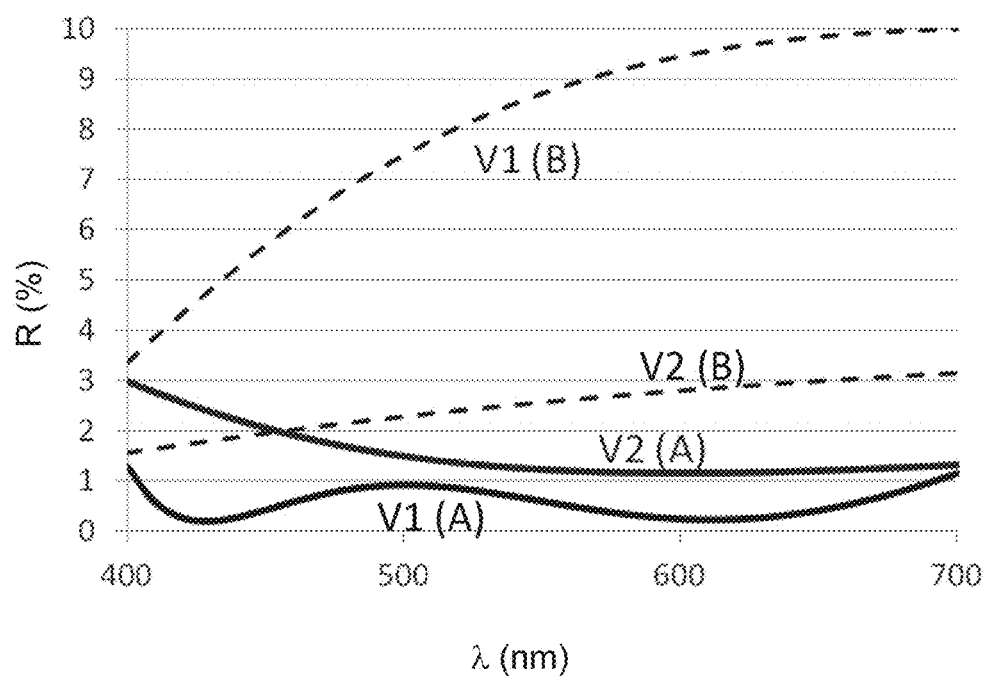
FIG. 2 shows a graphical illustration of reflection spectra at positions A and B of the lens shown in FIG. 1 for a conventional interference layer system composed of 4 layers (V1) and for a single layer composed of $MgF_2$ (V2)

FIG. 2 illustrates the influence of the layer thickness decrease toward the edge of the lens for comparative examples (not according to the invention) of conventional antireflection layers. The illustration shows the reflection R as a function of the wavelength $\lambda$ at the points A and B of the lens shown in FIG. 1 for a conventional interference layer system composed of four layers (V1) and for a single layer composed of $MgF_2$ (V2). The graphic illustrates that, at the midpoint A of the lens, the residual reflection that can be achieved with the interference layer system V1 composed of four layers is lower than that which can be achieved with the individual layer V2. At the point B, at which the layer thickness is reduced by 50%, a lower residual reflection R and thus a better antireflection arrangement are achieved with the individual layer V2. In other words, the multilayered interference layer system has a lower tolerance to changes in the layer thickness than the individual layer. With the method according to embodiments of the invention the intention is to produce an antireflection layer which has a particularly low residual reflection both in the case of perpendicular light incidence and in the case of oblique light incidence.

FIGS. 3A to 3F illustrate a first exemplary embodiment of the method for producing a reflection-reducing layer system on the basis of intermediate steps.

Figure 3A:
FIGS. 3A to 3F show a schematic illustration of one exemplary embodiment of the method for producing the reflection-reducing layer system on the basis of intermediate steps.

In the exemplary embodiment of the method, the substrate 10 illustrated in FIG. 3A is provided with a reflection-reducing layer system. In the exemplary embodiment illustrated, the substrate 10 is a planar substrate. Alternatively, in the method the substrate 10 could be, in particular, a curved substrate, such as, for example, the spherical lens illustrated in FIG. 1. The substrate 10 can be, in particular, a glass or plastics substrate.

Figure 3B:
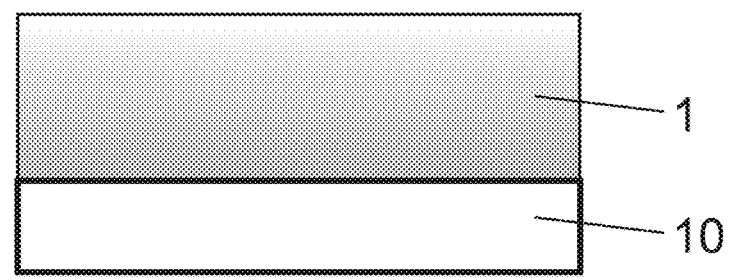

In the intermediate step illustrated in FIG. 3B, a refractive index gradient layer 1 has been applied to the substrate 10 by coevaporation of an inorganic material and an organic material. The refractive index gradient layer 1 preferably contains $MgF_2$ or $SiO_2$ as inorganic material and melamine as organic material. Alternatively, it is possible for the preferred inorganic materials $MgF_2$ or $SiO_2$ to be combined with a different organic material, for example, with one of the UV-absorbing organic materials described above. Instead of $MgF_2$, other fluorides such as $AlF_3$, for example, or fluoride mixtures such as cryolite, for example, can be used as inorganic material, wherein these fluorides are distinguished by a particularly low refractive index of n<1.4.

The coevaporation of the inorganic material and the organic material is preferably effected with ion assistance, wherein, by way of example, a plasma ion source is used to generate ions of nitrogen or some other inert gas with a maximum ion energy of approximately 45 eV to 60 eV, which impinge on the refractive index gradient layer 1 during vapor deposition.

The refractive index gradient layer 1 preferably has a thickness of 70 nm to 200 nm, preferably approximately 150 nm. The concentration of the organic material is preferably not more than 95% in a region at the interface with the substrate 10. In the region at the interface with the substrate 10, the concentration of the organic material is preferably chosen in such a way that the refractive index of the refractive index gradient layer 1 is matched to the refractive index of the substrate 10 in this region. In this context, "matched" means, in particular, that the refractive index of the refractive index gradient layer at the interface with the substrate deviates from the refractive index of the substrate by not more than 0.1, preferably not more than 0.05.

In a region at the interface facing away from the substrate 10, the concentration of the organic material is preferably less than 5%. The thickness of this region can advantageously be at least 30%, preferably at least 40%, or even at least 50%, of the total thickness of the refractive index gradient layer 1.

Figure 3C:
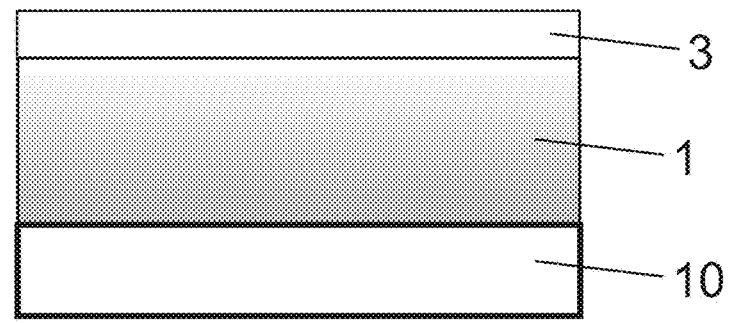

In the method step illustrated in FIG. 3C, an inorganic intermediate layer 3 preferably containing $SiO_2$ has been applied to the refractive index gradient layer 1. The inorganic intermediate layer preferably has a thickness of between 2 nm and 15 nm and is densified during growth preferably by ion bombardment with argon or oxygen ions.

Figure 3D:
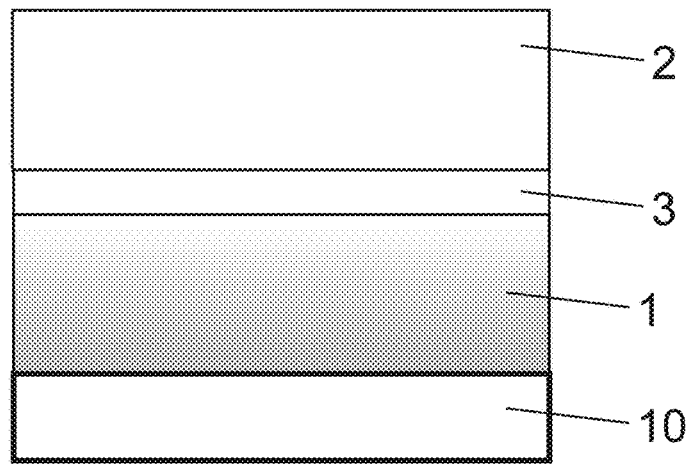

In the further method step illustrated in FIG. 3D, an organic layer 2 has been applied above the refractive index gradient layer 1 and the intermediate layer 3. The production of the organic layer 2, like the production of the refractive index gradient layer 1, is preferably effected by ion assisted vapor deposition by means of a plasma ion source which generates ions of nitrogen or some other inert gas having a maximum ion energy of approximately 45 eV to 60 eV. The organic layer 2 is preferably applied with a thickness of between 250 nm and 450 nm. The material of the organic layer 2 is preferably melamine.

Figure 3E:
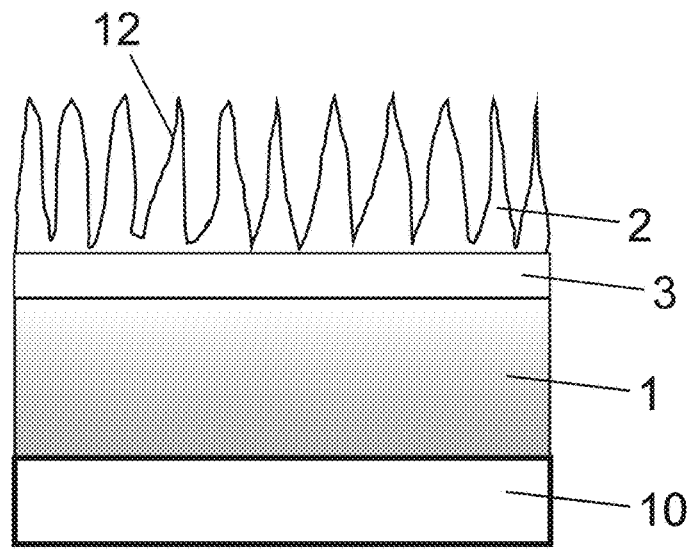

In the intermediate step of the method as illustrated in FIG. 3E, a nanostructure 12 has been produced in the organic layer 2 by means of a plasma etching process, wherein the nanostructure is formed by a multiplicity of structure elements in the form of elevations and depressions. The heights of the structure elements (peak-to-valley) are preferably on average between 80 nm and 130 nm, and their spacings (peak-to-peak) are preferably not more than 100 nm. In the plasma etching process, the surface of the substrate 10 is bombarded with ions by means of a plasma ion source, for example, in order to produce the nanostructure 12. Such a plasma etching process is known per se from the documents DE 10241708 B4 or DE 102008018866 A1 cited in the introductory part of the description and will therefore not be explained in any greater detail.

Before carrying out the plasma etching process, it is possible to apply a thin initial layer (not illustrated) to the surface to be structured, which preferably has a thickness of only approximately 2 nm. The initial layer is preferably a thin oxide layer, nitride layer or fluoride layer. This procedure is known per se from the document DE 102008018866 A1.

The nanostructure produces a refractive index gradient in the organic layer 2 which decreases in a direction pointing from the substrate 10 to the surface. The average effective refractive index of the nanostructure 12 is preferably less than 1.2. A region having a thickness of at least 100 nm and having a refractive index of less than 1.15 preferably arises at the surface.

The refractive index gradient layer 1 is thus succeeded by a second refractive index gradient layer, which is formed by the nanostructure 12 in the former layer 2 and in which the refractive index decreases to an even lower value. Preferably, the refractive index decreases in the entire reflection-reducing layer sequence in the direction from the substrate 10 toward the surface. In this way, an overall very thick refractive index gradient layer is produced which brings about a particularly good antireflection arrangement over a large angular range and wavelength range. In particular, it has been found that the reflection-reducing layer sequence produced by the method brings about a very good antireflection arrangement right into the edge regions of the substrate even in the case of curved substrates since the antireflection layer produced by the method is comparatively tolerant toward changes in the layer thickness.

Figure 3F:
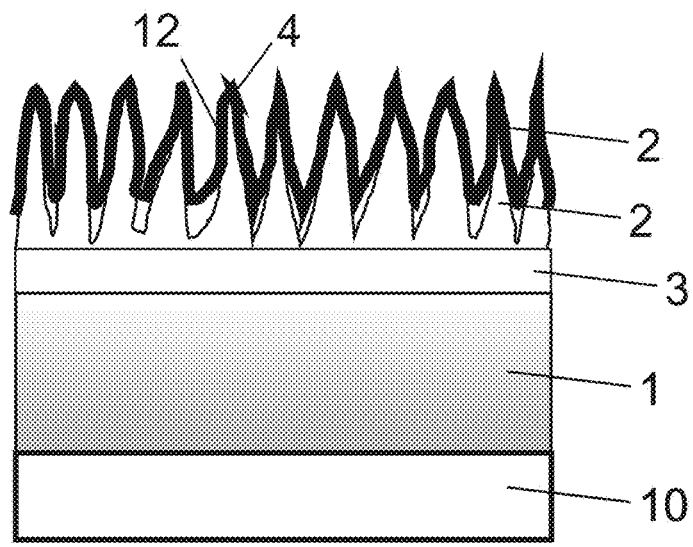

In one advantageous configuration of the method, as illustrated in FIG. 3F, a protective layer 4 is applied to the nanostructure 12. The protective layer 4 preferably has a thickness of 10 nm to 50 nm, with preference less than 30 nm, and can be an $SiO_2$ layer, for example. The protective layer 4 serves, in particular, for protecting the nanostructure 12 consisting of the organic material of the organic layer 2 against external influences, in particular against mechanical damage.

In one exemplary embodiment of the method, a reflection-reducing layer sequence was produced, the sequence of the method corresponding to FIGS. 3A to 3F. In this case, a plastics lens 10 composed of a polycarbonate (Makrolon) was provided with the reflection-reducing layer sequence. A refractive index gradient layer 1 having a thickness of 300 nm was applied to the plastics substrate 10 by coevaporation of the organic UV absorber methyl-2-cyano-3(4-hydroxyphenyl)acrylate (obtainable under the designation SEMAsorb 20163) and $MgF_2$.

The refractive index was matched by the mixture of the materials having the refractive indices 1.7 @ 500 nm (SEMAsorb 20163) and 1.38 ($MgF_2$) such that the effective refractive index is 1.55 in a region at the substrate and decreases gradually to 1.38 in a region at the surface. The proportion of the organic material is approximately 60% at the substrate 10 and less than 5% within the last 20 nm at the surface of the refractive index gradient layer 10. Overall, the proportion of the organic material in the refractive index gradient layer 10 is approximately 40%.

Firstly an approximately 5 nm thick inorganic intermediate layer 3 composed of $SiO_2$ for adhesion promotion and then a 250 nm thick organic layer 2 composed of melamine were subsequently applied by vapor deposition in the same vacuum process. During the vapor deposition of the $SiO_2$ layer 3, argon and oxygen ions were accelerated in the direction of the growing $SiO_2$ layer 3 with the aid of a plasma ion source, wherein the ion source was operated with Ar and $O_2$ flow rates of in each case 10 sccm and ion energies of between 60 eV and 120 eV were generated.

The vapor deposition of the organic layer 2 composed of melamine was effected with ion assistance by an inert gas and with a maximum ion energy of 60 eV, with addition of Ar at a flow rate of up to 10 sccm. Afterward, with a suitable ion source which generates ions having an average energy of 80 eV (40 eV to 160 eV), a nanostructure 12 was etched into the melamine layer 2. The nanostructure 12 in the organic layer 2 produced in this way has structure elements having heights of at least 80 nm and a maximum of 140 nm depending on etching time and ion energy. Finally, a 20 nm thick protective layer 4 composed of SiO$_2$ was applied. The average effective refractive index of the nanostructured organic layer 2 including the protective layer 4 is in the range of 1.05 to 1.15.

Figure 4:
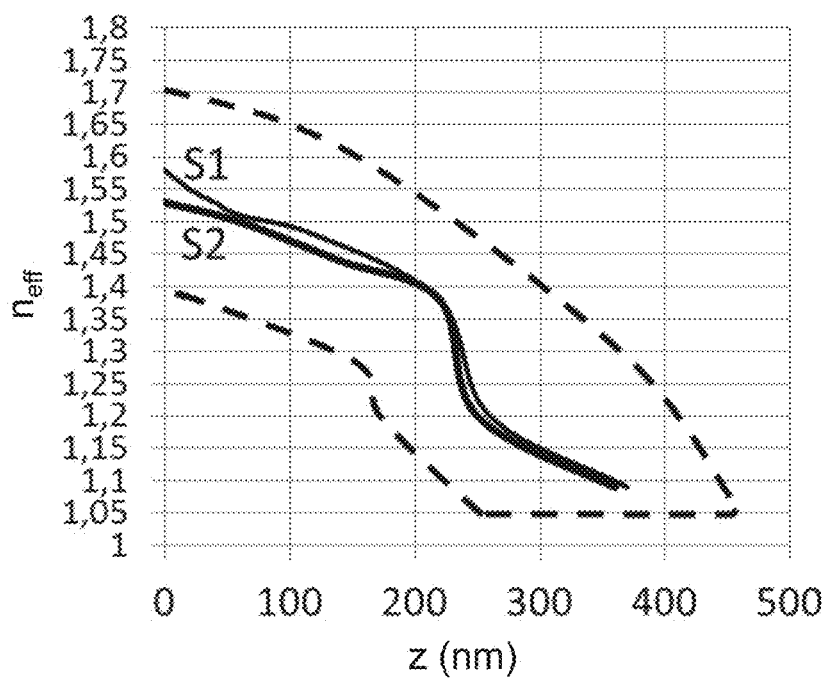
FIG. 4 shows a graphical illustration of the profile of the effective refractive index $n_{eff}$ for a first and a second exemplary embodiment of the reflection-reducing layer system.

The profile of the effective refractive index n$_{eff}$ as a function of a spatial coordinate z—proceeding from the substrate—of the first exemplary embodiment of the reflection-reducing layer system produced in this way is illustrated in FIG. 4 (curve S1) in comparison with a second exemplary embodiment (curve S2), which is explained below. The dashed lines mark a range of expedient refractive index profiles which can be realized by the method.

Figure 5:
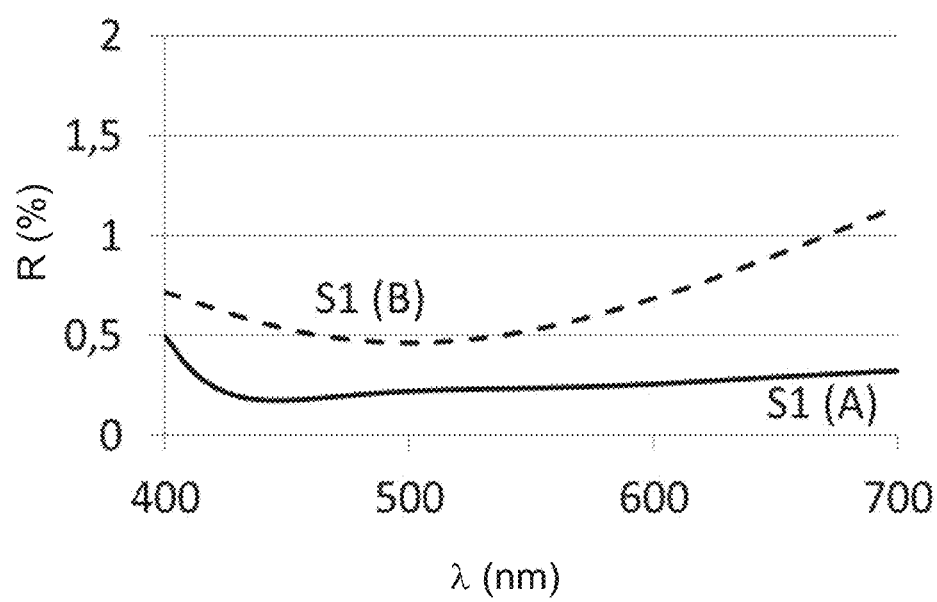
FIG. 5 shows a graphical illustration of reflection spectra at positions A and B of the lens shown in FIG. 1 for a first exemplary embodiment of the reflection-reducing layer system.

FIG. 5 illustrates the reflection R as a function of the wavelength λ for the first exemplary embodiment of the reflection-reducing layer system, such as occurs at positions A and B of the curved lens in accordance with FIG. 1. The reflection-reducing layer system has a total layer thickness of 370 nm in the central region of the curved lens and attains an average residual reflection of <0.4% in the spectral range of 400 nm to 700 nm. In the edge region of the lens where the angle of vapor incidence is up to 60° and the layer thickness has decreased to 50%, an average residual reflection of <1% is attained.

In a second exemplary embodiment, a lens composed of a cycloolefin polymer (Zeonex) was used as the substrate 10. A refractive index gradient layer 1 having a gradually decreasing refractive index and a thickness of 250 nm was applied by coevaporation of melamine and MgF$_2$. The proportion of melamine is approximately 25% in the region at the interface with the substrate and is less than 5% within the last 50 nm at the surface of the refractive index gradient layer 1. A 300 nm thick melamine layer 2 was subsequently applied by vapor deposition in the same process. Afterward, with a suitable ion source which generates ions having an average energy of 80 eV (40 eV to 160 eV), a nanostructure 12 was etched into the melamine layer 2. The nanostructure 12 in the organic layer 2 produced in this way has structure elements whose spacings are on average not more than 100 nm. Finally, a 25 nm thick protective layer 4 composed of SiO$_2$ was applied by vapor deposition. The SiO$_2$ preferably deposits on the crests of the structures in the directional process, such that the filling factor and the shape of the nanostructure 12 change slightly. The thickness of the nanostructured organic layer 2 including the protective layer 4 is at least 100 nm and a maximum of 130 nm.

Figure 6:
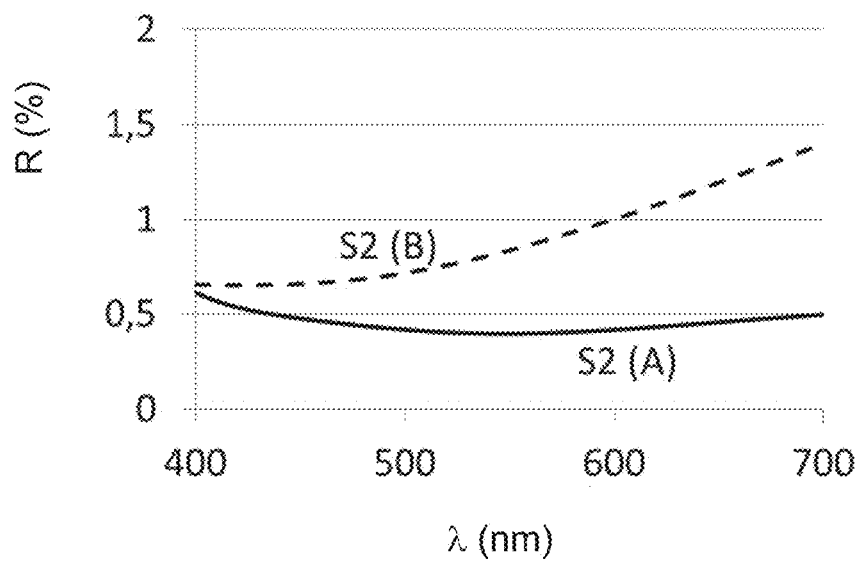
FIG. 6 shows a graphical illustration of reflection spectra at positions A and B of the lens shown in FIG. 1 for a second exemplary embodiment of the reflection-reducing layer system.

FIG. 6 illustrates the reflection R as a function of the wavelength λ for the second exemplary embodiment of the reflection-reducing layer system, such as occurs at positions A and B of the curved lens in accordance with FIG. 1. The reflection-reducing layer system has a total layer thickness of 360 nm in the central region of the curved lens and attains an average residual reflection of 0.5% in the spectral range of 400 nm to 700 nm. In the edge region of the lens where the angle of vapor incidence is up to 60° and the layer thickness has decreased to 50%, an average residual reflection of <1% is attained.

Figure 7:
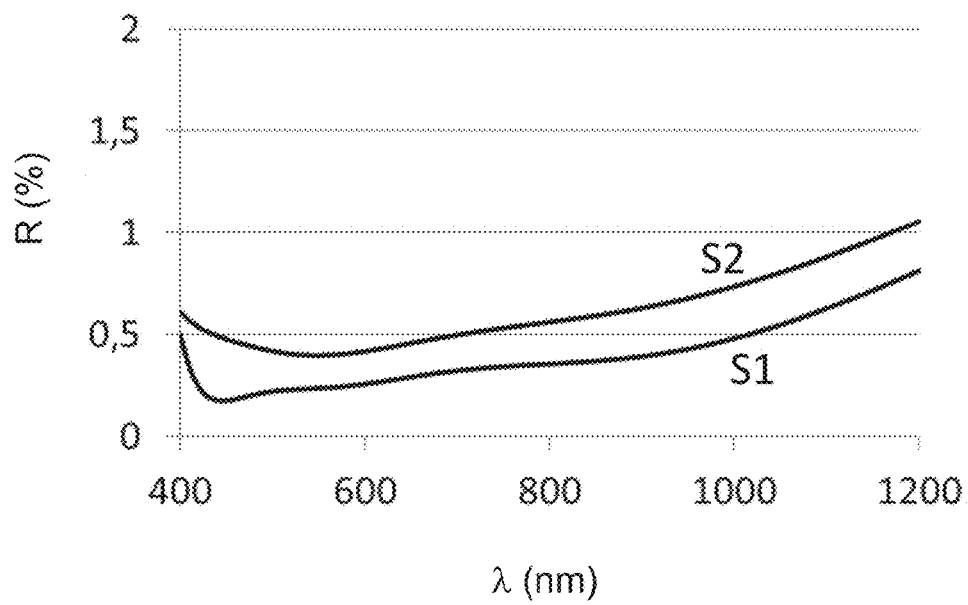
FIG. 7 shows a graphical illustration of reflection spectra for the first and second exemplary embodiments of the reflection-reducing layer system.

FIG. 7 shows, for both exemplary embodiments S1 and S2, the reflection R as a function of the wavelength λ in a larger wavelength range of 400 nm to 1200 nm.

The reflection spectra illustrated in FIGS. 5 to 7 make it clear that the antireflection layer produced by the method described herein has a particularly low residual reflection even at positions on curved substrates at which reduced layer thicknesses occur on account of an increased angle of vapor incidence during the coating process. Furthermore, the antireflection layer produced by the method is also advantageous for planar substrates if the intention is to achieve a particularly low residual reflection at large angles of light incidence, for example, at angles of incidence of up to 80°, and/or over a large wavelength range, for example, of 400 nm to 1200 nm.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A method for producing a reflection-reducing layer system on a substrate, the method comprising:
   depositing a refractive index gradient layer on the substrate by coevaporation of an inorganic material and an organic material, wherein the refractive index gradient layer has a refractive index which decreases in a growth direction;
   depositing an organic layer above the refractive index gradient layer; and
   producing a nanostructure in the organic layer by a plasma etching process.

2. The method according to claim 1, wherein the nanostructure has a plurality of structure elements whose heights are on average between 80 nm and 130 nm and whose spacings are on average less than 100 nm.

3. The method according to claim 1, wherein the inorganic material of the refractive index gradient layer has a refractive index n1 where $1.37 \leq n1 \leq 1.46$, and wherein the organic material of the refractive index gradient layer has a refractive index n2>n1 where $1.6 \leq n2 \leq 1.9$.

4. The method according to claim 1, wherein the refractive index of the refractive index gradient layer at an interface with the substrate is matched to a refractive index of the substrate.

5. The method according to claim 1, wherein the organic material is a UV-absorbing material.

6. The method according to claim 1, wherein the organic layer has at least regionally an effective refractive index of between 1.05 and 1.38.

7. The method according to claim 1, further comprising, prior to depositing the organic layer, depositing an inorganic intermediate layer on the refractive index gradient layer.

8. The method according to claim 1, further comprising, after producing the nanostructure, applying a protective layer having a thickness of between 10 nm and 50 nm to the nanostructure.

9. The method according to claim 1, wherein the entire reflection-reducing layer system is produced in a vacuum process.

10. The method according to claim 1, wherein the organic layer is deposited by plasma ion assisted deposition using a plasma ion source, and wherein the nanostructure is subsequently produced by increasing the ion energy and/or changing a process gas of the plasma ion source.

11. The method according to claim 1, wherein the organic layer comprises melamine.

* * * * *